United States Patent
Corbishley

(10) Patent No.: US 10,177,730 B2
(45) Date of Patent: Jan. 8, 2019

(54) PACKET-BASED RADIO RECEIVER WITH AUTOMATIC GAIN CONTROL

(71) Applicant: Nordic Semiconductor ASA, Trondheim (NO)

(72) Inventor: Phil Corbishley, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 15/535,947

(22) PCT Filed: Dec. 14, 2015

(86) PCT No.: PCT/GB2015/053946
§ 371 (c)(1),
(2) Date: Jun. 14, 2017

(87) PCT Pub. No.: WO2016/097702
PCT Pub. Date: Jun. 23, 2016

(65) Prior Publication Data
US 2017/0346461 A1    Nov. 30, 2017

(30) Foreign Application Priority Data
Dec. 15, 2014    (GB) .................................. 1422281.4

(51) Int. Cl.
*H04B 1/06*    (2006.01)
*H04B 7/00*    (2006.01)
(Continued)

(52) U.S. Cl.
CPC ......... *H03G 3/3036* (2013.01); *H03G 3/3068* (2013.01); *H03G 3/3078* (2013.01); *H04B 1/06* (2013.01); *H04B 17/318* (2015.01)

(58) Field of Classification Search
CPC .. H03G 3/3078; H03G 3/3036; H03G 3/3068; H03G 3/3073; H03G 3/00;
(Continued)

(56) References Cited

U.S. PATENT DOCUMENTS 5,999,578 A    12/1999  Ha
7,149,263 B2 *  12/2006  Higure ................... H04L 27/08
                                                              375/345
(Continued)

FOREIGN PATENT DOCUMENTS

| EP | 1 504 527 B1 | 9/2005 |
| EP | 1 691 489 A1 | 8/2006 |
| WO | WO 2010/123573 A1 | 10/2010 |

OTHER PUBLICATIONS

International Search Report and Written Opinion for PCT/GB2015/053946, dated May 31, 2017, 18 pages.
(Continued)

*Primary Examiner* — Nhan Le
(74) *Attorney, Agent, or Firm* — Klarquist Sparkman, LLP

(57) ABSTRACT

A packet-based radio receiver (10) comprises an automatic gain control system (17) and a signal-level detector (18, 19, 20) for monitoring an analog signal derived from radio signals received by the radio receiver. The signal-level detector (18, 19, 20) comprises a binary memory cell (22, 24) and a monitoring system. The monitoring system comprises a comparator (21, 23) arranged to receive a reference voltage at a first input and the analog signal at a second input. The monitoring system is arranged to (i) continuously monitor the voltage of the analog signal, (ii) detect when the monitored signal exceeds the reference voltage, and (iii) store a predetermined binary value in the memory cell (22, 24) in response to such a detection. The automatic gain control system (17) is arranged to control the gain of a
(Continued)

variable-gain component (12, 13, 14) of the radio receiver in dependence on the contents of the binary memory cell (22, 24).

20 Claims, 3 Drawing Sheets

(51) Int. Cl.
  *H03G 3/30* (2006.01)
  *H04B 17/318* (2015.01)

(58) Field of Classification Search
  CPC ...... H03G 3/001; H03G 3/007; H04B 17/318; H04B 7/15535; H04B 1/06
  See application file for complete search history.

(56) References Cited

U.S. PATENT DOCUMENTS

| | | | |
|---|---|---|---|
| 7,212,798 B1 | 5/2007 | Adams et al. | |
| 7,498,882 B2* | 3/2009 | Dally | H03G 3/3036 330/278 |
| 7,606,544 B2* | 10/2009 | Hennig | H03G 3/3068 330/129 |
| 7,773,702 B2* | 8/2010 | Xiong | H03G 3/001 330/254 |
| 8,428,535 B1 | 4/2013 | Cousinard et al. | |
| 9,264,280 B1* | 2/2016 | Waheed | H04L 27/3809 |
| 2003/0025623 A1 | 2/2003 | Brueske et al. | |
| 2007/0275686 A1 | 11/2007 | Stevenson et al. | |
| 2012/0244825 A1 | 9/2012 | Green et al. | |
| 2013/0279556 A1 | 10/2013 | Seller | |

OTHER PUBLICATIONS

Search Report under Section 17(5) for GB1422281.4, dated Mar. 27, 2015, 5 pages.

Search Report under Section 17(6) for GB1422281.4, dated Dec. 23, 2015, 3 pages.

\* cited by examiner

PACKET-BASED RADIO RECEIVER WITH AUTOMATIC GAIN CONTROL

CROSS REFERENCE TO RELATED APPLICATIONS

This is the U.S. National Stage of International Application No. PCT/GB2015/053946, filed Dec. 14, 2015, which was published in English under PCT Article 21(2), which in turn claims the benefit of Great Britain Application No. 1422281.4, filed Dec. 15, 2014. The Great Britain application is incorporated by reference herein in its entirety.

This invention relates to apparatus for receiving packet-based radio transmissions.

A radio receiver typically has an antenna which receives all radio signals across a wide range of frequencies. Unwanted signals must be attenuated so that a channel of interest can be extracted at an acceptable signal-to-noise ratio for subsequent processing. This attenuation can be achieved by a channel filter, comprising one or more stages situated in series along a signal path. Filtering may be applied to an analogue signal, or to a digitised signal, or both. For example, a low-pass filter may be applied to a signal after it has passed a heterodyne mixing stage so as to remove signal components outside a desired channel.

Radio receivers must typically amplify relatively-weak, received radio signals in order to provide a useful output. This amplification may be implemented in one or more stages along a signal path; for instance, to RF signals received from the antenna and/or to an intermediate frequency (IF) signal after heterodyning. Amplification may be viewed as a discrete stage along the signal path, or it may be considered as part of a filtering or mixing stage; e.g., if it occurs immediately before or after, or during, a filtering or mixing operation.

Radio receivers normally include some form of automatic gain control (AGC) to alter the gain of an amplifier in the receiver, depending on the strength of the received signal. Without any AGC, the amplifier could overload, resulting in non-linear behaviour that introduces errors in the output, or it may provide insufficient amplification for the received signal to be demodulated or decoded correctly.

One exemplary known arrangement for a packet-based radio receiver is shown in FIG. 1. The radio receiver 1 receives RF signals from an antenna 2. A low-noise amplifier (LNA) 3 amplifies these signals, before they enter a mixer 4. The mixer 4 performs an analog down-mixing to an intermediate frequency (IF); e.g. to shift signals from around 2.4 GHz to around 1 MHz.

The signal is then passed through a first, analogue stage of the channel filter 5, which attenuates frequencies outside a range containing the desired channel (e.g. filtering with a bandwidth of 6 MHz, when the channel is 2 MHz wide). The partially-filtered signal is then digitised by an analogue-to-digital converter (ADC) 6, before entering a second, digital stage of the channel filter 7, where further attenuation of unwanted signal components occurs (e.g. filtering with a bandwidth of 2 MHz, to leave just the desired channel). The filtered signal then leaves the second stage of the channel filter 7 for further processing, such as demodulation, decoding, etc. In such an arrangement, the second stage of the channel filter 7 would typically be of narrower bandwidth than the first stage of the channel filter 5.

An automatic gain control (AGC) system comprises AGC logic 8 for controlling the gain of the LNA 3. It does this based on information it receives from a pre-channel-filter level detector 9, which is arranged to measure the signal level between the LNA 3 and the mixer 4, and a post-channel-filter level detector 10, which is arranged to measure the signal level at the output of the second channel filter 7. The AGC system 6 may aim to maximise the gain of the LNA 3 without saturating any of the components in the signal path, or it may aim to minimise the gain of the LNA 3 while still providing a required signal-to-noise ratio at the output of the second channel filter stage 7 for subsequent demodulation and decoding of a received packet. Unlike some non-packet-based radio receivers, which may have a relatively long period of time over which gain can be optimised, a packet-based radio may need to optimise its gain very quickly, within the duration of a packet preamble, before the remainder of the digital packet is received.

The present invention aims to improve upon known radio receivers, and, from a first aspect, the invention provides a packet-based radio receiver comprising:
  a channel filter for attenuating components of a received radio signal outside a desired frequency channel, wherein the channel filter comprises first and second channel filter stages connected in series along a signal path, with the second channel filter stage being downstream of the first channel filter stage;
  a first signal-level detector located on the signal path upstream of the first channel filter stage;
  a second signal-level detector located on the signal path downstream of the second channel filter stage;
  a third signal-level detector located on the signal path between the first and second channel filter stages; and
  an automatic gain control system arranged to receive level-detection information from the first, second and third signal-level detectors, and to use the received level-detection information to control the gain of one or more variable-gain components located on the signal path.

Thus it will be seen by those skilled in the art that, in accordance with the invention, the automatic gain control (AGC) system uses the signal level between the two channel filter stages, as well as from before and after the channel filter stages, to control gain along the signal path. This has been found to enable better performance. In particular, in some embodiments, the AGC system is arranged to control gain at the first channel filter stage. This allows the AGC to increase the gain at the first channel filter stage while avoiding saturation. This has been found to improve the overall reception of the receiver, compared with known arrangements, especially when there is a strong interfering signal in an adjacent channel to the desired channel. Without the present invention, the interfering signal might easily saturate a first, relatively-wide channel filter stage, before it is removed by a second, narrower channel filter stage.

The variable-gain component or components may comprise any form of amplification and/or attenuation means or system. These may be considered part of the AGC system. In some embodiments, the AGC system may be arranged to control the gain of an amplifier (e.g. a low-noise amplifier) that receives signals from an antenna before any filtering occurs. The AGC may additionally or alternatively be arranged to control the gain of one or both of the first and second channel filter stages. In such embodiments, a filter stage may comprise a variable amplifier and/or attenuator as part of the filter, or a variable amplifier and/or attenuator may be located immediately upstream or downstream of the filter stage. In some embodiments, the radio receiver may comprise an analogue mixer, which may comprise a variable amplifier and/or attenuator as part of the mixer (e.g. as an integral part of the mixer design, or having a variable amplifier and/or attenuator located immediately upstream or downstream of the main filter circuit). The AGC may additionally or alternatively be arranged to control the gain of the analogue mixer.

The first channel filter stage preferably has a wider bandwidth than the second channel filter stage. For example, it may be two, three, four or more times wider. In some embodiments, it is approximately three times the channel width. The first channel filter stage may be an analogue filter. The second channel filter stage may be a digital filter, although this is not essential. In other embodiments, the first and second channel filter stages may both filter analogue signals, or may both filter digital signals.

In some embodiments, the AGC system may be arranged to receive further level-detection information from one or more further signal-level detectors, and to use this further information, in addition to that from the first, second and third signal-level detectors, when controlling the gain of the one or more variable-gain components located on the signal path. In some embodiments, the radio receiver comprises more than two channel filter stages (e.g. three, four, or more channel filter stages), which may be arranged in series, and the AGC system may then receive level-detection information from locations between each respective adjacent pair of channel filter stages. The AGC system may be arranged to control the gain of some or all of these channel filter stages. For example, the radio receiver may comprise a series of two, three, or more bi-quad filters with a signal-level detector between each bi-quad filter. Each bi-quad filter may have variable gain, and the AGC system may be arranged to control the gain of each based on level-detection information from the signal-level detectors.

In some embodiments, the AGC system may control the gain of the first channel filter stage based largely or entirely on level-detection information obtained from the third signal-level detector (e.g. from a signal-level detector located at the output of the channel filter). The AGC system may be arranged to increase the gain of the first channel filter stage upwards when the signal-level detector indicates no saturation, and downwards when the signal-level detector indicates saturation. Saturation may be determined as occurring when a predetermined analogue or digital threshold is met or exceeded.

The radio receiver may comprise an analogue-to-digital converter (ADC), which may be located in the signal path between the first and second channel filter stages. In such embodiments, the third signal-level detector is preferably located downstream of the ADC; for example, to monitor the output of the ADC. In this way, information from the third signal-level detector can be used by the AGC system to check that the ADC output does not saturate. Preferably, the first channel filter stage and the ADC are designed so that the ADC will saturate at a lower signal level than the first channel filter stage; in this way, it can be determined that the first channel filter stage has not saturated by checking that the output of the ADC has not saturated. The third signal-level detector may be arranged to communicate to the AGC when the output of the ADC saturates (e.g. when the output is all binary '1's). In some embodiments, this may be communicated by way of a binary signal, as is explained in more detail below. In some embodiments, the ADC is a successive approximation register (SAR) ADC; this is desirable because such an ADC does not wrap around when it saturates, but remains at the rail. This means that a signal-level detector monitoring the output of an SAR ADC for saturation can be implemented relatively simply, using just a few logic gates. Such an arrangement is also much more power-efficient than having an analogue signal-level detector at the output of the of the first channel-filter stage.

In general, the signal-level detectors may take any suitable form. One or more of the signal-level detectors may be arranged to determine the root-mean-square power of an analogue signal over a period of time. Such a signal-level detector may, for example, rectify the signal and average the rectified signal over a time period.

The AGC system may receive and/or sample outputs from the signal-level detectors at intervals—preferably at regular intervals, such as every one or two milliseconds. In a preferred set of embodiments, the signal-level detectors are arranged to measure and output a signal level within one or two cycles of a clock that is provided to the AGC system. This is relatively straightforward to achieve for signal-level detectors that are monitoring a digital signal, but it is not straightforward for signal-level detectors that are monitoring an analogue signal. Traditionally, such analogue signal-level detectors are relatively slow, because they need to integrate or average the signal power over a substantial period of time. This introduces undesirable lag, especially when the radio receiver needs to optimise its gain within the duration of the preamble of an incoming data packet, before the rest of the data packet arrives.

The applicant has devised a better approach. Thus, one or more of the signal-level detectors, for monitoring an analogue signal (for example, the first signal-level detector), preferably comprises a binary memory cell (e.g. a flip-flop) and a monitoring system arranged to (i) continuously monitor the voltage of the analogue signal, (ii) detect when the monitored signal exceeds a predetermined voltage threshold, and (iii) store a predetermined binary value in the memory cell in response to such a detection.

This signal-level detector can respond faster than an averaging detector. The applicant has also realised that a radio received with an automatic gain control system based on determining when voltage thresholds are exceeded can be particularly power efficient. Such an approach is especially useful when, as in preferred embodiments, the radio receiver is arranged to receive and process (e.g. demodulate and/or decode) a data packet transmitted using a constant-envelope modulation, such as Gaussian frequency-shift keying (GFSK). This is because such modulation results in a received signal that has a relatively level amplitude (compared with OFDM, for example), which is particularly well suited to the voltage-threshold control techniques described herein.

Such an arrangement is novel in its own right and thus, from a further aspect, the invention provides a packet-based radio receiver comprising an automatic gain control system and a signal-level detector for monitoring an analogue signal derived from radio signals received by the radio receiver, wherein the signal-level detector comprises a binary memory cell and a monitoring system arranged to (i) continuously monitor the voltage of the analogue signal, (ii) detect when the monitored signal exceeds a predetermined voltage threshold, and (iii) store a predetermined binary value in the memory cell in response to such a detection, and wherein the automatic gain control system is arranged to control the gain of a variable-gain component of the radio receiver in dependence on the contents of the binary memory cell.

The variable-gain component may be or comprise an amplifier, an attenuator, a mixer, a filter, or any other suitable component or system. The AGC system may be arranged to control the gain of a plurality of variable-gain components of the radio receiver in dependence on the contents of the binary memory cell. It may, of course, also use other information, in addition to the contents of the binary memory cell, to determine how to control one or more variable-gain components.

Any optional or essential feature of the first aspect of the invention may be a feature of this aspect also.

In any of the aspects and embodiments described herein, such a signal-level detector is preferably arranged to retain the contents of the binary memory cell until it receives a reset signal. It preferably comprises a reset mechanism, arranged to set the contents of the binary memory cell to a default value, different from the predetermined binary value, in response to receiving a reset signal. In this way, the signal-level detector may be used to determine when the monitoring signal first exceeds the predetermined voltage threshold after the detector has been reset. In some embodiments, the reset signal may be provided by the AGC system. The radio receiver may be arranged so that the signal-level detector is reset at intervals—preferably at regular intervals—for example, by the AGC system sending a reset signal to the signal-level detector at intervals. The AGC system may be arranged to determine the value stored in the memory cell at intervals (preferably at regular intervals); it may be arranged to reset the signal-level detector after each such determination.

The monitoring system may, and preferably does, comprise a comparator. This comparator may, and preferably does, receive a reference voltage at one input and the monitored signal at a second input. Such an arrangement can be particularly responsive, even to transient peaks, which may exceed the reference voltage only briefly. One aspect of the invention therefore provides a packet-based radio receiver comprising:

an automatic gain control system; and
a signal-level detector for monitoring an analogue signal derived from radio signals received by the radio receiver, wherein:
the signal-level detector comprises a binary memory cell and a monitoring system;
the monitoring system comprises a comparator arranged to receive a reference voltage at a first input and the analogue signal at a second input;
the monitoring system is arranged to (i) continuously monitor the voltage of the analogue signal, (ii) detect when the monitored signal exceeds the reference voltage, and (iii) store a predetermined binary value in the memory cell in response to such a detection; and
the automatic gain control system is arranged to control the gain of a variable-gain component of the radio receiver in dependence on the contents of the binary memory cell.

In any of the aspects and embodiments described herein, the output of the comparator may be sent to the set or reset input of a flip-flop, or to some other circuit for writing the predetermined binary value to the memory cell when the output of the comparator goes high (or low, depending on how the circuit is designed).

The monitoring system monitors the voltage of the analogue signal continuously; i.e., it does not use a discrete sampling process. It will be understood that it may, however, cease monitoring the voltage for periods of time.

The signal-level detector is preferably arranged to make the contents of the binary memory cell available to an AGC system; e.g. by a line from the memory cell to the AGC system (such a line may optionally contain one or more logical components, such as a NOT gate). The binary memory cell may be a RAM cell or other suitable memory cell, but in preferred embodiments it is a flip-flop.

The threshold may be a minimum voltage threshold, and the signal-level detector may be arranged to detect when the monitored signal first exceeds the minimum voltage threshold after a reset, or the threshold may be a maximum voltage threshold, and the signal-level detector may be arranged to detect when the monitored signal first exceeds the maximum voltage threshold after a reset. In some embodiments, the signal-level detector comprises: a first binary memory cell; a second binary memory cell; means (e.g. a monitoring system) for detecting when the analogue signal exceeds a minimum voltage threshold and for storing a predetermined binary value in the first binary memory cell in response to such a detection; and means (e.g. the same, or another, monitoring system) for detecting when the analogue signal exceeds a maximum voltage threshold, higher than the minimum voltage threshold, and for storing a predetermined binary value in the second binary memory cell in response to such a detection. The memory cells may be respective set-reset flip-flops. The predetermined binary values may be the same value or different values. The signal-level detector is preferably arranged so that a single reset signal (e.g., from the AGC system), resets the contents of both memory cells to respective default values.

More generally, in some embodiments, one, some or all of the signal-level detectors, of whatever type (digital or analogue), may output one of a first set of signals when the monitored signal level has exceeded a threshold (e.g., a voltage threshold, or a digital value threshold) during a time period (e.g. during the time since a reset signal was last received by the detector), and one of a second set of signals, distinct from the first set, when the monitored signal level has not exceeded the threshold during the time period. The first set of signals may comprise signals in which a particular signal line is in a first binary logic state (e.g. a "one" bit, or a high voltage), and the second set of signals may comprise signals in which that signal line is in a second binary logic state (e.g. a "zero" bit, or a low voltage). The signal line or lines may lead to the AGC system.

Thus, in some embodiments, one, some or all of the signal-level detectors, of whatever type, may output a first signal (e.g. on a particular signal line) when the monitored signal level has exceeded a maximum threshold (e.g., a voltage threshold, or a digital value threshold) during a time period (e.g. during the time since a reset signal was last received by the detector), and a second signal (e.g. on the same signal line) when the monitored signal level has not exceeded the maximum threshold during the time period. The first signal may be output to the AGC as a first binary logic state (e.g. a "one" bit, or a high voltage), over a binary channel, and the second signal may be output as a second binary logic state (e.g. a "zero" bit, or a low voltage).

In some embodiments, one, some or all of the signal-level detectors, of whatever type, may output one of a first signal (e.g. on a particular signal line) when the monitored signal level has not reached a minimum threshold (e.g., a voltage threshold, or a digital value threshold) during a time period (e.g. during the time since a reset signal was last received by the detector), and a second signal (e.g. on the same signal line) when the monitored signal level has reached the minimum threshold during the time period. The first signal may be output to the AGC as a first binary logic state (e.g. a "one" bit, or a high voltage), over a binary channel, and the second signal may be output as a second binary logic state (e.g. a "zero" bit, or a low voltage).

In some embodiments, one, some or all of the signal-level detectors, of whatever type, are arranged to output a first signal (e.g. across two binary signal lines) when the monitored signal level has exceeded a maximum threshold (e.g., a voltage threshold, or a digital value threshold) during a time period (e.g. during the time since a reset signal was last received by the detector) and a second signal (e.g. across the same two signal lines) when the monitored signal has not reached a minimum threshold (e.g., a voltage threshold, or a digital value threshold), smaller than the maximum threshold, during the time period. They may also be arranged to output a third signal (e.g. across the same two signal lines) when the monitored signal has reached the minimum threshold and has not exceed the maximum threshold during the time period. In some embodiments, these three signals may be output to the AGC system over a two-bit channel, such as a pair of wires, each of which can be at a binary "one" voltage level or a binary "zero" voltage level. For example, a first binary line may be set high by the signal-level detector if the monitored signal has gone too high since the last reset, and be low otherwise, and a second binary line may be set high by the signal-level detector if the monitored signal has been constantly too low since the last reset, and be low otherwise. In this case, a signal of "0 0" for the too-high and too-low lines respectively would indicate that the signal level is acceptable; "1 0" would indicate that the signal has gone too high; "0 1" would indicate that the signal has remained too low; and "1 1" is not a legitimate output. If the AGC system receives a signal indicating that the monitored signal has both exceeded the maximum voltage threshold and not reached the minimum voltage threshold during the time period it may infer that an error has occurred; it may, for instance, output an error condition, e.g. by triggering an interrupt in a microprocessor.

Such an arrangement has been found to facilitate particularly power-efficient gain control, by allowing the AGC system to be implemented as a relatively simply finite state machine. If there are three signal-level detectors, each outputting signals encoding one of three states to the AGC, then the AGC has a total of 3×3×3=27 input conditions to respond to (ignoring any error conditions). The AGC system preferably implements a logic table having an entry for at least each non-error input combination (e.g., for 27 different input conditions).

Thus, in a preferred set of embodiments, the AGC system comprises a state machine whose state is determined (wholly or in part) by the level-detection information that it receives from the signal-level detectors. In some embodiments, the state machine receives no inputs from any other components in the radio receiver.

More generally, the output of the AGC system is preferably determined by the level-detection information that it receives from the signal-level detectors. It may also be determined by the current gain setting of one or more of the variable-gain components. For example, if a first variable-gain component is already at a minimum or maximum setting, this may cause the AGC system to adjust the gain of a second variable-gain component, when it would otherwise have adjusted the gain of the first variable-gain component.

The AGC system may control one or more variable-gain components by outputting commands to the respective component; for example, by outputting a command to increase the gain, or to decrease the gain, or possibly to maintain a current gain. This may be accomplished in any appropriate way; e.g., by generating suitable analogue or digital signals. These commands may comprise, or be accompanied by, an indication of a quantity representing the size of any desired change in gain. Alternatively, a change in gain may be effected through incremental steps of predetermined size.

In preferred embodiments, the AGC system is configured so that information from at least two, or possibly three or more, of the signal-level detectors influences the control of a single variable-gain component. For example, the outputs of the first and third signal-level detectors (and possibly the second signal-level detector also) may together determine what control is applied to a low-noise amplifier located upstream of any filtering component (or to some other variable-gain component), with the output of each detector taken individually being insufficient to fully determine the control. In some embodiments, information from one signal-level detector is used to determine the control applied to two or more variable-gain components, which may be situated at different points in the signal path (e.g. separated from one another by a filter).

It will be appreciated that elements that are described herein as belonging to the AGC system may, where appropriate, be part of a signal-level detector, or as part of a variable-gain component, and vice versa. Where one such component ends and another starts may be somewhat subjective or arbitrary, especially where there is digital logic between them. The AGC system may be regarded as comprising part or all of the signal-level detectors and/or variable-gain component or components, or it may be seen as being distinct therefrom. So, for example, references herein to the nature of the output from a signal-level detector to the AGC system do not necessarily imply any particular physical or structural arrangement of the circuit components.

In some embodiments, the radio receiver is implemented as integrated device, e.g. on silicon (with or without the antenna). It may be integrated with a microcontroller arranged to receive demodulated received radio signals from the radio receiver. The radio receiver or a microcontroller may decode data from a received data packet, and may perform an operation in dependence on the received data. The radio receiver may be arrange to receive and process data packets conforming to one or more Bluetooth™ standards. The radio receiver may be combined with a radio transmitter, which may have some components in common with the radio receiver. It will be appreciated that any component or system, as referred to herein, may comprise any number of features, such as switches or resistors or capacitors, and any suitable connections therebetween.

Features of any aspect or embodiment described herein may, wherever appropriate, be applied to any other aspect or embodiment described herein. Where reference is made to different embodiments or sets of embodiments, it should be understood that these are not necessarily distinct but may overlap.

Certain preferred embodiments of the invention will now be described, by way of example only, with reference to the accompanying drawings, in which.

Figure 1:
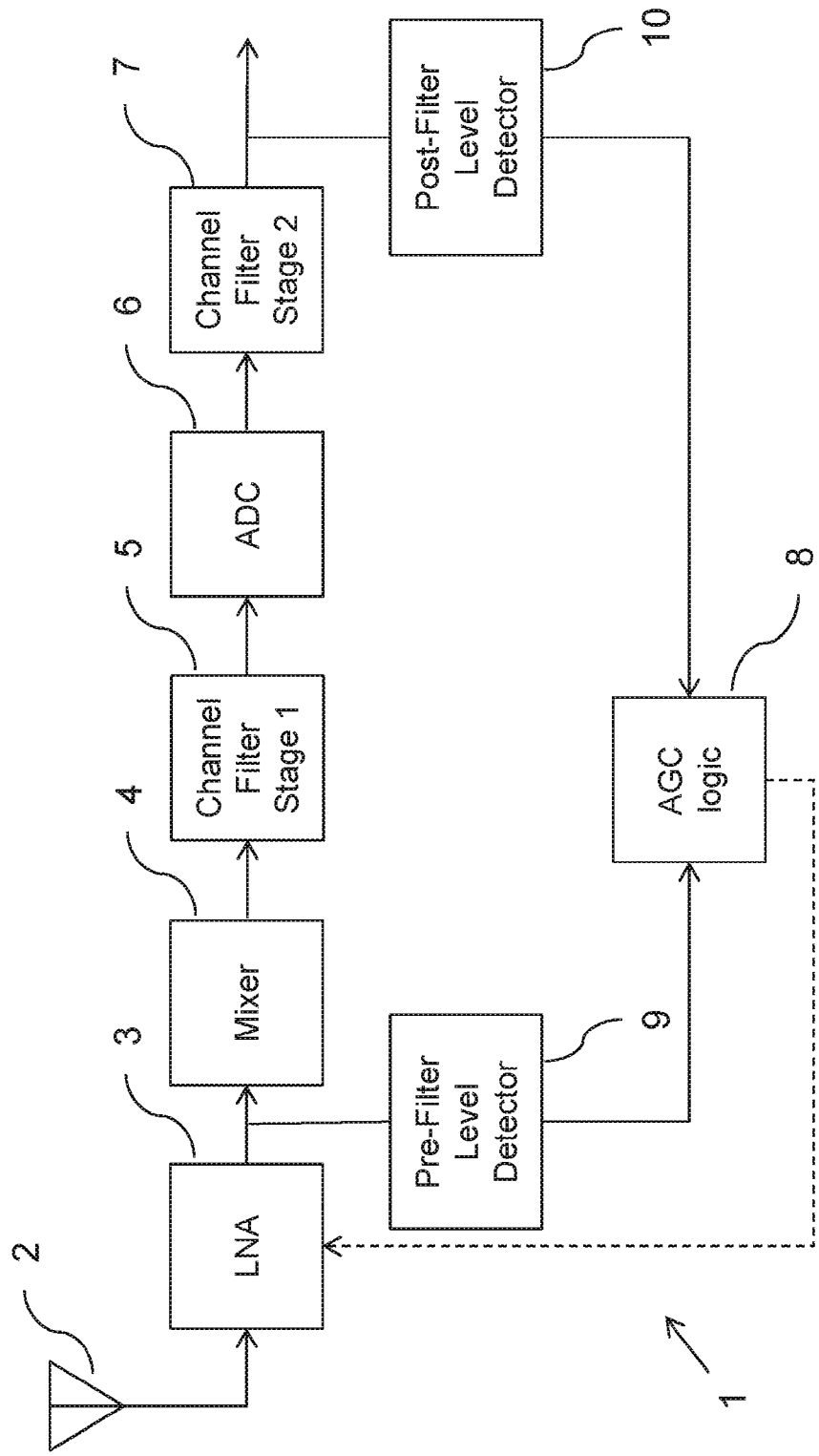
FIG. 1 is a schematic drawing of components of a prior-art radio receiver.
Figure 2:
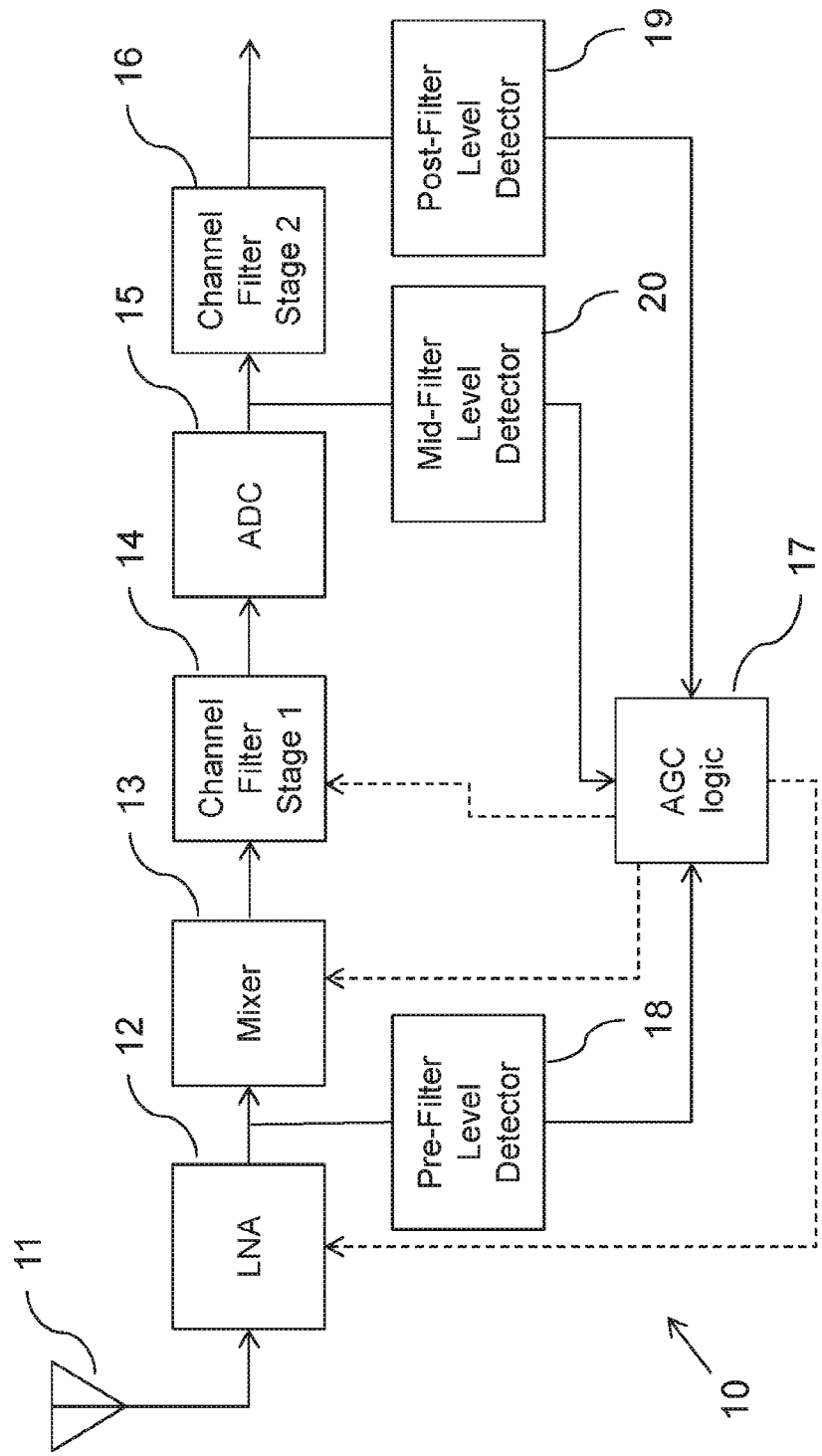
FIG. 2 is a schematic drawing of components of a radio receiver embodying the invention.

FIG. 2 shows a packet-based radio receiver 10 which receives RF signals from an antenna 11 and which passes signals from a channel of interest (e.g., a 2 MHz wide channel at around 2.4 GHz) on for further processing by digital logic.

A low-noise amplifier (LNA) 12 amplifies the received RF signals, before they enter a mixer 13. This mixer 13 performs an analog down-mixing to an intermediate frequency (IF); e.g. to shift signals from around 2.4 GHz to around 1 MHz. The signals then pass through a first, analogue stage of the channel filter 14, which attenuates frequencies outside a range containing the desired channel (e.g. filtering with a bandwidth of 6 MHz). The partially-filtered signal is then digitised by a successive approximation register (SAR) analogue-to-digital converter (ADC) 15, before entering a second, digital stage of the channel filter 16, where further attenuation of unwanted signal components occurs (e.g. filtering with a bandwidth of 2 MHz, to leave just the desired channel). The filtered signal then leaves the second stage of the channel filter 16 for further processing, such as demodulation and decoding of a received data packet. The second stage of the channel filter 16 is of narrower bandwidth than the first stage of the channel filter 14.

An automatic gain control (AGC) system comprises AGC logic 17 arranged to control the gain of the LNA 12, the mixer 13 and the first stage of the channel filter 14. In some embodiments it may also control other components, such as the second channel filter stage 16. It implements this control using a state machine which receives, as input, signals from (i) a pre-channel-filter level detector 18, which is arranged to measure the analogue voltage level between the LNA 12 and the mixer 13, (ii) a post-channel-filter level detector 19, which is arranged to measure the digital signal level at the output of the second channel filter 16, and (iii) a mid-channel-filter level detector 20, which is arranged to measure the digital signal level at the output of the ADC 15.

The pre-channel-filter level detector 18 is shown in greater detail in FIG. 3, as described below.

The post-channel-filter level detector 19 and the mid-channel-filter level detector 20 are arranged to detect when the digital signal reaches or exceeds a predetermined maximum threshold, such as reaching the maximum binary value that can be output by the respective immediately upstream component. They may also each monitor the signal to check whether it has reached a minimum threshold at least once since the detector 19, 20 was last reset. This may be implemented by measuring the signal peak and comparing this against a minimum and a maximum threshold, to detect if the signal goes too high or is persistently too low, since the last reset. The detectors 19, 20 may store the results of this monitoring in memory cells (e.g. a flip flops) and make them available to the AGC logic 17, or the AGC logic 17 may receive one or more quantitative measurements from the detectors 19, 20 and perform any required comparison operations itself. Any such memory cells may be reset to a default value when a reset signal is received from the AGC logic 17. The first channel-filter stage 14 and the ADC 15 are designed so that the ADC 15 will saturate before the first channel-filter stage 14, so that the maximum threshold can simply be the maximum possible output of the ADC 15.

The AGC logic 17 periodically checks the output of each of the signal-level detectors 18, 19, 20, to determine whether the signal at the respective point in the signal path is (i) too low, (ii) too high, or (iii) at an acceptable level. It feeds these three possible conditions, for each of the detectors 18, 19, 20, into its state machine, to determine a required command for each of the LNA 12, the mixer 13 and the first stage of the channel filter 14. The state machine is also aware of the current gain settings, and can also use this information when determining the required commands. These commands may be to (i) increase the gain, (ii) decrease the gain, or (iii) make no change. The AGC logic 17 issues appropriate signals to these variable-gain components, depending on the required command from the state machine. For example, if the post-channel-filter detector 19 detects too much signal amplitude, then if the LNA 12 gain and mixer 13 gain are already at a minimum, the AGC logic 17 will reduce the gain of the first channel-filter stage 14, but if the LNA 12 gain and mixer 13 gain are not at a minimum, the AGC logic 17 will reduce them first.

The state machine may implement any suitable decision logic. However, in some embodiments, it is designed so as to minimise the gain of the LNA 12 and the mixer 13 as far as possible, while providing a signal-to-noise ratio at the output of the second channel filter stage 16 that meets a minimum threshold level. This ensures that subsequent demodulation and decoding of a received packet can be carried out effectively, while reducing the chance of any of the radio receiver's components saturating if a strong interfering signal appears on a channel close to the wanted channel.

Figure 3:
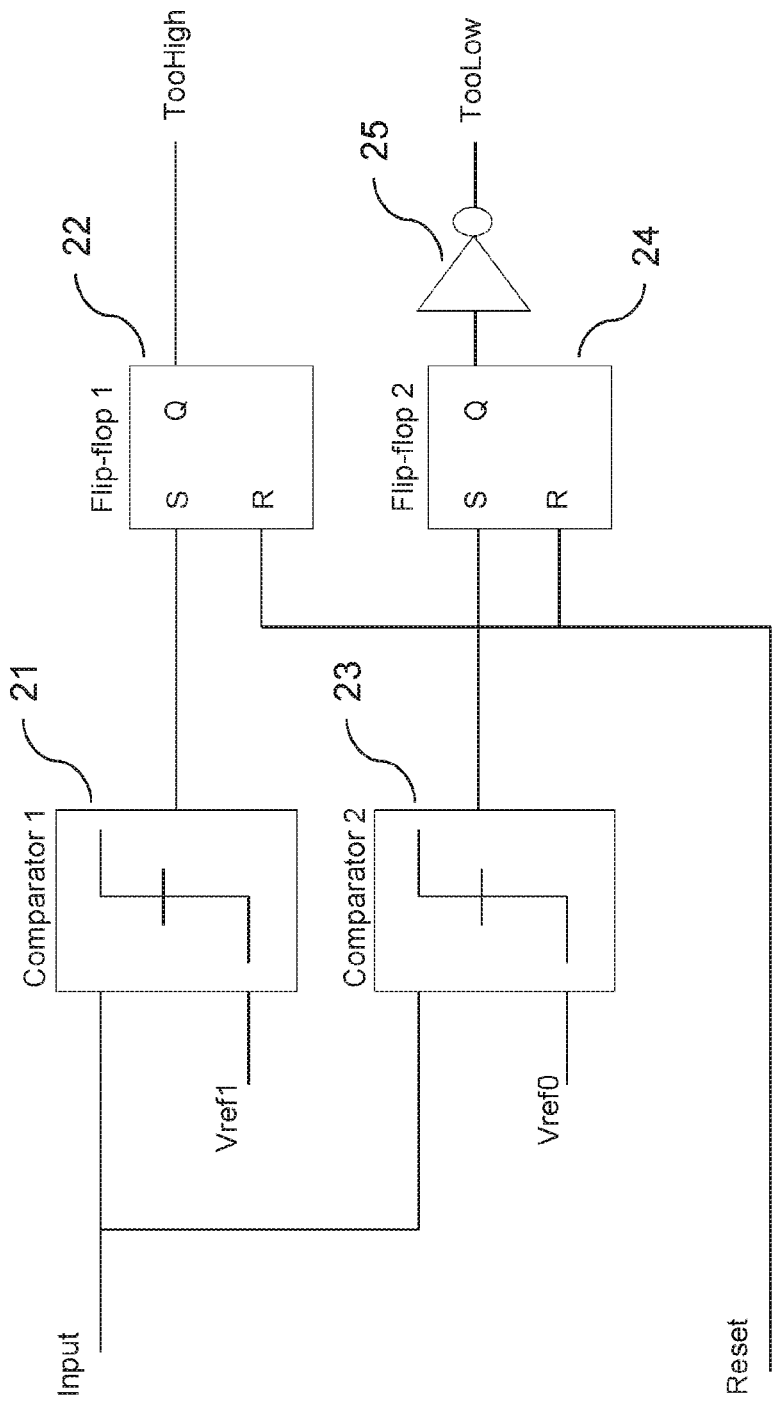
FIG. 3 is a circuit diagram of a level detector embodying the invention.

FIG. 3 shows the design of the pre-channel-filter level detector 18, which has one input from the signal path, and is connected to the AGC logic 17 by three lines: a reset line, a "TooHigh" line and a "TooLow" line. It also receives two reference voltages as inputs: Vref1 and Vref0, where Vref1>Vref0. The detector 18 has a first comparator 21 which compares the analogue signal input with Vref1, and sends its output to the set input S of a first flip-flop 22. The output Q of the first flip-flop 22 is sent to the AGC logic 17 over the "TooHigh" line. The detector 18 also has a second comparator 23 which compares the analogue signal input with Vref0, and sends its output to the set input S of a second flip-flop 24. The output Q of the second flip-flop 24 is inverted by a NOT gate 25 and sent to the AGC logic 17 over the "TooLow" line. The reset input R of both flip-flops 22, 24 is connected to the reset line from the AGC logic 17.

In use, the pre-channel-filter level detector 18 is reset at regular intervals by the AGC logic 17, which assert the reset line and causing both flip-flops 22, 24 to reset, sending the "TooHigh" line low and the "TooLow" line high (because of the NOT gate 25). If the voltage of the monitored analogue signal then exceeds Vref1, the output of the first flip-flop 22 will change to high until it is next reset, meaning that the "TooHigh" output is asserted. If the voltage of the monitored analogue signal never reaches Vref0, the second flip-flop 24 will continue to have a low output until it is next reset; this output will be inverted by the NOT gate so that the "TooLow" output line is asserted. If the monitored analogue signal does pass Vref0 at least once after the reset, the second flip-flop 24 will switch to a high output, which will cause the "TooLow" output to be deasserted. At the end of the monitoring interval, the AGC logic 17 will capture the outputs of the "TooHigh" and "TooLow" lines and pass these as inputs to its state machine. It will also reset the first and second flip-flops 22, 24 so as to start the next monitoring interval.

It will be appreciated by those skilled in the art that the invention has been illustrated by describing one or more specific embodiments thereof, but is not limited to these embodiments; many variations and modifications are possible, within the scope of the accompanying claims. Any references to prior art contained herein do not constitute an admission that such art forms part of the common general knowledge in any country of the world. The word "comprise", and variants thereof, such as "comprises" and "comprising", are used in an inclusive or open sense (i.e. so as not to preclude the presence or addition of further features), except where the context requires otherwise due to explicit language or necessary implication.

The invention claimed is:

1. A packet-based radio receiver comprising:
an automatic gain control system; and
a signal-level detector for monitoring an analogue signal derived from radio signals received by the radio receiver,
wherein:
the signal-level detector comprises a first binary memory cell, a second binary memory cell, and a monitoring system;
the monitoring system comprises a comparator arranged to receive a reference voltage at a first input and the analogue signal at a second input;
the automatic gain control system is arranged to control the gain of a variable-gain component of the radio receiver in dependence on the contents of the binary memory cells;
the monitoring system is arranged to (i) continuously monitor the voltage of the analogue signal, (ii) detect when the analogue signal exceeds a minimum voltage threshold, and (iii) store a predetermined binary value in the first binary memory cell in response to such a detection, and is further arranged to detect when the analogue signal exceeds a maximum voltage threshold, higher than the minimum voltage threshold, and to store a predetermined binary value in the second binary memory cell in response to such a detection; and
the signal-level detector is arranged to output to the automatic gain control system a first signal if the analogue signal has exceeded the maximum voltage threshold since a reset signal was last received by the signal-level detector, and to output a second signal if the analogue signal has not reached the minimum voltage threshold since a reset signal was last received by the signal-level detector.

2. The packet-based radio receiver of claim 1, wherein the automatic gain control system is arranged to control the gain of each of a plurality of variable-gain components of the radio receiver in dependence on the contents of the binary memory cells.

3. The packet-based radio receiver of claim 1, wherein the signal-level detector is arranged to retain the contents of the binary memory cells until it receives a reset signal.

4. The packet-based radio receiver of claim 1, arranged to reset the signal-level detector at regular intervals.

5. The packet-based radio receiver of claim 1, wherein the automatic gain control system is arranged to determine the values stored in the memory cells at regular intervals.

6. The packet-based radio receiver of claim 1, comprising:
a channel filter for attenuating components of a received radio signal outside a desired frequency channel, wherein the channel filter comprises first and second channel filter stages connected in series along a signal path, with the second channel filter stage being downstream of the first channel filter stage;
a first signal-level detector located on the signal path upstream of the first channel filter stage;
a second signal-level detector located on the signal path downstream of the second channel filter stage; and
a third signal-level detector located on the signal path between the first and second channel filter stages,
wherein one of the first, second and third signal-level detectors is the aforesaid signal-level detector that comprises said first binary memory cell, said second binary memory cell, and said monitoring system, and wherein the automatic gain control system is arranged to receive level-detection information from the first, second and third signal-level detectors, and to use the received level-detection information to control the gain of one or more variable-gain components located on the signal path.

7. The packet-based radio receiver of claim 6, wherein the automatic gain control system is arranged to control the gain of the first channel filter stage.

8. The packet-based radio receiver of claim 6, wherein the first channel filter stage is an analogue filter and the second channel filter stage is a digital filter.

9. The packet-based radio receiver of claim 6, further comprising an analogue-to-digital converter (ADC), wherein the third signal-level detector is arranged to monitor the output of the ADC.

10. The packet-based radio receiver of claim 9, wherein the first channel filter stage and the ADC are designed so that the ADC will saturate at a lower signal level than the first channel filter stage.

11. The packet-based radio receiver of claim 6, wherein the automatic gain control system is arranged to sample outputs from the first, second, and third signal-level detectors at regular intervals.

12. The packet-based radio receiver of claim 6, wherein the radio receiver is arranged to receive and demodulate a data packet transmitted using a constant-envelope modulation.

13. The packet-based radio receiver of claim 6, wherein signal-level information from at least two of the first, second, and third signal-level detectors affects the control of a single variable-gain component in the signal path.

14. The packet-based radio receiver of claim 1, wherein the signal-level detector is arranged to output the first and second signals over first and second binary signal lines.

15. The packet-based radio receiver of claim 14, wherein the signal-level detector is arranged to set the first binary signal line to a first value if the monitored signal has exceeded the maximum voltage threshold during the time period, and to set the first binary signal line to a second value otherwise.

16. The packet-based radio receiver of claim 14, wherein the signal-level detector is arranged to set the second binary signal line to a first value if the monitored signal has not reached the minimum voltage threshold during the time period, and to set the second binary signal line to a second value otherwise.

17. The packet-based radio receiver of claim 14, wherein:
the signal-level detector is arranged to set the first binary signal line to a first first-binary-signal-line value if the monitored signal has exceeded the maximum voltage threshold during the time period, and to set the first binary signal line to a second first-binary-signal-line value otherwise;
the signal-level detector is arranged to set the second binary signal line to a first second-binary-signal-line value if the monitored signal has not reached the minimum voltage threshold during the time period, and to set the second binary signal line to a second second-binary-signal-line value otherwise; and
the automatic gain controller is configured to determine that the signal level is acceptable when the first binary signal line is set to the second first-binary-signal-line value and the second binary signal line is set to the second second-binary-signal-line value.

18. The packet-based radio receiver of claim 14, wherein:
the signal-level detector is arranged to set the first binary signal line to a first first-binary-signal-line value if the monitored signal has exceeded the maximum voltage threshold during the time period, and to set the first binary signal line to a second first-binary-signal-line value otherwise;

the signal-level detector is arranged to set the second binary signal line to a first second-binary-signal-line value if the monitored signal has not reached the minimum voltage threshold during the time period, and to set the second binary signal line to a second second-binary-signal-line value otherwise; and the automatic gain controller is configured to signal an error condition if the first binary signal line is set to the first first-binary-signal-line value and the second binary signal line is set to the first second-binary-signal-line value.

19. The packet-based radio receiver of claim 1, wherein the signal-level detector is arranged to output to the automatic gain control system a third signal if the analogue signal has reached the minimum voltage threshold and has not exceed the maximum voltage threshold since a reset signal was last received by the signal-level detector.

20. The packet-based radio receiver of claim 1, wherein the automatic gain control system comprises a finite state machine implementing a logic table that has entries for the first signal state, the second signal state, and the third signal state.

* * * * *